(12) United States Patent  
Moriyama et al.

(10) Patent No.: US 9,018,520 B2
(45) Date of Patent: Apr. 28, 2015

(54) SOLAR CELL AND MANUFACTURING METHOD THEREOF

(75) Inventors: Shun Moriyama, Annaka (JP); Takenori Watabe, Annaka (JP); Takashi Murakami, Annaka (JP); Shintarou Tsukigata, Annaka (JP); Mitsuhito Takahashi, Annaka (JP); Hiroyuki Otsuka, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 13/822,845

(22) PCT Filed: Sep. 5, 2011

(86) PCT No.: PCT/JP2011/070105
§ 371 (c)(1),
(2), (4) Date: May 28, 2013

(87) PCT Pub. No.: WO2012/036002
PCT Pub. Date: Mar. 22, 2012

(65) Prior Publication Data
US 2013/0247974 A1  Sep. 26, 2013

(30) Foreign Application Priority Data
Sep. 14, 2010 (JP) ................................. 2010-205162

(51) Int. Cl.
*H01L 31/0236* (2006.01)
*H01L 31/068* (2012.01)

(52) U.S. Cl.
CPC ........ *H01L 31/02363* (2013.01); *H01L 31/068* (2013.01); *Y02E 10/547* (2013.01)

(58) Field of Classification Search
CPC .................................................... H01L 31/0236
USPC .......... 136/206, 244, 245, 252, 256, 258, 261
See application file for complete search history.

(56) References Cited

FOREIGN PATENT DOCUMENTS

| JP | 09-129907 A | 5/1997 |
|---|---|---|
| JP | 10-007493 A | 1/1998 |
| JP | 2002-076388 A | 3/2002 |
| JP | 2005-209726 A | 8/2005 |

OTHER PUBLICATIONS

Takenori et al. JP2005209726A, machine translation, publication date Aug. 4, 2005.*
International Search Report of PCT/JP2011/070105, mailing date of Dec. 13, 2011.

* cited by examiner

*Primary Examiner* — Susan D Leong
(74) *Attorney, Agent, or Firm* — Westerman, Hattori, Daniels & Adrian, LLP

(57) ABSTRACT

Disclosed is a solar cell having a silicon monocrystal substrate surface with a textured structure and, near the surface of said substrate, a damage layer reflecting the slice processing history from the time of manufacture of the silicon monocrystal substrate. The damage layer near the surface of the silicon monocrystal substrate is derived from the slice processing history at the time of manufacture of the substrate and functions as a gettering site, contributing to a longer lifetime of the substrate minority carriers. Thanks to this effect, the solar cell characteristics are dramatically increased. Further, new damage need be inflicted, and no additional work is required because damage from the slicing is used.

11 Claims, 2 Drawing Sheets

STEP 1

STEP 2

STEP 3

STEP 4

SOLAR CELL AND MANUFACTURING METHOD THEREOF

TECHNICAL FIELD

This invention relates to a solar cell and a method of manufacturing the same.

BACKGROUND ART

Solar cells are semiconductor devices for converting optical energy to electric power. Among others, monocrystalline silicon solar cells become the mainstream solar cells of widespread use because they have high conversion efficiency and are relatively easy to manufacture. For the monocrystalline silicon solar cells, it is a common practice to form microscopic protrusions, known as texture, on the surface for the purpose of preventing a reflection loss, as disclosed in JP-A H09-129907 (Patent Document 1) and JP-A H10-7493 (Patent Document 2), for example. If the surface of a solar cell is flat, a part of incident light is reflected and lost without being converted to electric current. By contrast, the texture structure offers a chance for part of the reflected light to reenter the solar cell plural times. Since the solar cell is consequently reduced in reflectivity of the light-receiving surface, short-circuit current is mitigated, and the solar cell performance is significantly improved.

As disclosed in Patent Documents 1 and 2, the texture structure mentioned above is formed by anisotropic etching of a monocrystalline silicon substrate. Anisotropic etching makes use of a difference in etch rate dependent on silicon plane orientation. Specifically, a monocrystalline silicon substrate is prepared by slicing with a wire saw or similar tool so that the substrate has a work damaged layer originating from the slicing step. After the damaged layer is etched away, anisotropic etching is carried out by immersing the substrate again in a hot alkaline aqueous solution of sodium hydroxide, potassium hydroxide, potassium carbonate, sodium carbonate or sodium hydrogencarbonate. Notably, an amount of 2-propanol is often dissolved in the alkaline aqueous solution to promote the reaction.

The urgent requirements currently posed on the solar cell include an increase of photoelectric conversion efficiency and a cost reduction by simplification of the solar cell manufacture process. On the surface of the substrate from which the damaged layer has been etched away, sometimes abrasive grains and contaminants from the slurry and wire saw used in the slicing step are left in minute amount. It is very difficult to exclude traces of contaminants even if such contaminants are washed away with a surfactant or the like.

Besides, heavy metals and other contaminants adhere to the substrate during the steps of forming p-n junction, forming antireflective coating, and forming front and back side electrodes and the like. It is difficult to remove these contaminants completely even if the substrate is cleaned with a mixed aqueous solution of hydrochloric acid and aqueous hydrogen peroxide, for example. They cause a reduced bulk lifetime and become a barrier to efficient solar cells.

It is noted that a method of manufacturing a solar cell is known in the art as described in JP-A 2005-209726 (Patent Document 3). The solar cell is manufactured by slicing a monocrystalline silicon ingot to form a monocrystalline silicon substrate, the monocrystalline silicon substrate including a primary damaged layer formed by slicing work on a first major surface side, removing the primary damaged layer mechanically or chemically, inflicting a new damage by another mechanical work other than the slicing work, to form a secondary damaged layer thinner than the primary damaged layer, anisotropically etching the secondary damaged layer to form a texture structure, and forming a light-receiving side electrode on the texture structure.

CITATION LIST

Patent Document

Patent Document 1: JP-A H09-129907
Patent Document 2: JP-A H10-7493
Patent Document 3: JP-A 2005-209726

SUMMARY OF INVENTION

Technical Problem

An object of the invention is to provide a solar cell and manufacture method that can improve the conversion efficiency and bulk lifetime of a solar cell of quality in a very efficient way without increasing the number of steps.

Solution to Problem

Making extensive investigations to attain the above object, the inventors have found that with respect to a monocrystalline silicon substrate which is prepared by slicing a monocrystalline silicon ingot so that the substrate may include a slice damaged layer on its surface, better results are obtained if the damaged layer is chemically removed, but not completely, so that the damaged layer preferably having a thickness of 0.2 to 5 μm is left on the substrate even after texture formation. More particularly, it is believed in the art that if the damaged layer originating from the slicing step during the preparation of the monocrystalline silicon substrate is not completely removed, problems arise that the surface recombination rate is increased and the solar cell performance is degraded. Therefore, texture formation is carried out after the damaged layer originating from the slicing step is removed with an alkaline aqueous solution. Since the work damaged layer originating from the slicing step is as thick as 10 μm or more, deep chemical etching is carried out until the damaged layer is removed almost completely. Quite unexpectedly, the inventors have found through extensive investigations that if the damaged layer originating from the slicing step is removed, but not completely, so that the damaged layer having a thickness of 0.2 to 5 μm is intentionally left on the substrate, then the getter effect is enhanced, the bulk lifetime is increased, and the solar cell performance is improved.

It is noted that Patent Document 3 cited above discloses to form a damaged layer prior to texture formation. This method involves inflicting a new damage by another mechanical work other than the damage by slicing work, to form a secondary damaged layer thinner than the primary damaged layer, subjecting the secondary damaged layer to anisotropic etching to form a texture structure, and forming a light-receiving side electrode on the texture structure. After the damaged layer originating from the slicing step is completely etched away, another damaged layer is newly formed. Thus, the method includes cumbersome operations and requires a careful control of the thickness of the secondary damaged layer. In contrast, the method of the invention does not require to form a damaged layer separately because the damaged layer left after texture formation originates from the damaged layer formed by the slicing step. Also, an improvement in bulk lifetime is achieved merely by retaining only a fraction of the damaged layer originating from the slicing step, which is believed in the prior art to be removed in order to reduce the surface recombination rate, as discussed above.

Accordingly, the present invention provides a solar cell and a method of manufacturing the same as defined below.

Claim 1:

A solar cell comprising a monocrystalline silicon substrate having a texture structure at its surface, the monocrystalline silicon substrate including a damaged layer near its surface, the damaged layer originating from a slicing step during the preparation of the substrate.

Claim 2:

The solar cell of claim 1 wherein the damaged layer has a depth of 0.2 to 5 μm.

Claim 3:

The solar cell of claim 1 or 2 wherein the monocrystalline silicon substrate has a major surface of {100} plane.

Claim 4:

A method of manufacturing a solar cell, comprising the steps of forming a texture on a monocrystalline silicon substrate by chemical etching, said monocrystalline silicon substrate having on its surface a damaged layer originating from a slicing step during the preparation of the substrate, forming a p-n junction, and forming electrodes, wherein the step of forming a texture is carried out such that the damaged layer originating from a slicing step during the preparation of the substrate is left behind, and the damaged layer thus remains near the surface of the textured substrate.

Claim 5:

The method of claim 4 wherein the step of forming a texture is carried out such that the damaged layer may have a depth of 0.2 to 5 μm after the texture formation.

Claim 6:

The method of claim 4 or 5 wherein the monocrystalline silicon substrate has a major surface of {100} plane, and the chemical etching is anisotropic etching using an alkaline aqueous solution so that the texture structure is formed as an arrangement of regular pyramid protrusions delimited by four {111} planes.

Claim 7:

The method of any one of claims 4 to 6 wherein the alkaline aqueous solution used for chemical etching of the surface of the monocrystalline silicon substrate is an aqueous solution containing sodium hydroxide, potassium hydroxide, potassium carbonate, sodium carbonate or sodium hydrogencarbonate.

With the method of manufacturing a solar cell according to the invention, crystal defects introduced in the damaged layer left on the texture function as getter sites for impurity atoms, prolonging the minority carrier lifetime (or bulk lifetime) and contributing to an improvement in conversion efficiency.

Notably, the damaged layer to be left should desirably have a depth of 0.2 to 5 μm. The damaged layer with a depth in excess of 5 μm may cause to increase the surface recombination rate, resulting in a solar cell having degraded properties. The damaged layer with a depth of less than 0.2 μm may achieve insufficient getter effect.

The monocrystalline silicon substrate may have a major surface of {100} plane. When anisotropic etching is carried out using an alkaline aqueous solution, the texture structure is formed as an arrangement of regular pyramid protrusions delimited by four {111} planes. A better antireflective effect is also achievable.

The damaged layer used herein may be one originating from the slicing step. Then, the number of steps is not increased because of no need to inflict new damage.

As used herein, the term "damaged layer" refers to a layer of silicon crystal which consists of a regular arrangement of silicon atoms in theory, but contains many dislocation defects, cracks and fractures caused by the wire saw or similar tool for slicing.

Advantageous Effects of Invention

For the monocrystalline silicon substrate according to the invention, the damaged layer originating from the slicing step during the preparation of the substrate and left near the surface functions as getter site, contributing to an improvement in the lifetime of minority carriers in the substrate. By virtue of this effect, the solar cell performance is dramatically improved. Also the number of steps is not increased because the damage by slicing is utilized rather than inflicting new damage.

DESCRIPTION OF EMBODIMENTS

The structure of a solar cell according to the invention is described below with reference to the drawings although the invention is not limited to the solar cell of the illustrated structure.

Figure 1:
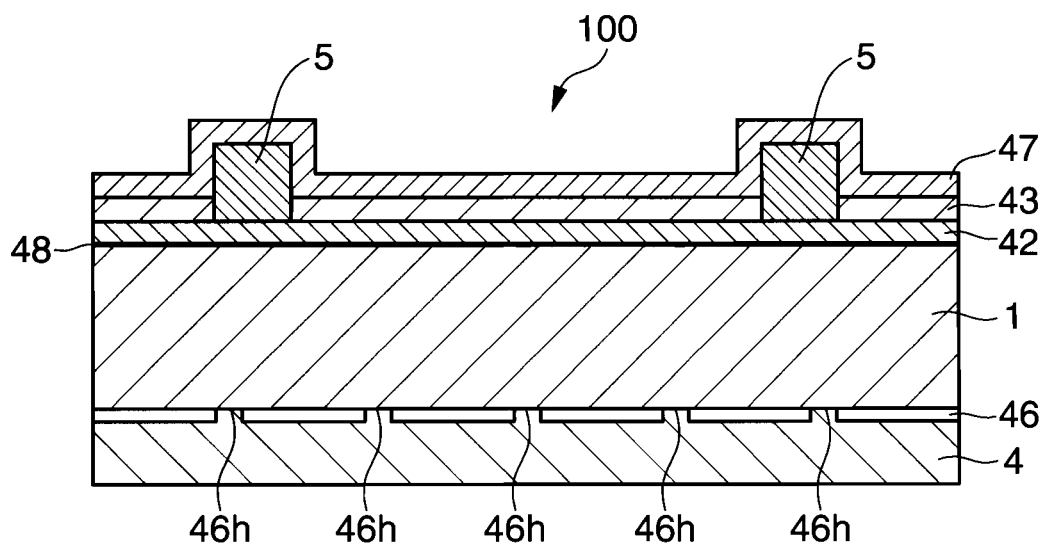
FIG. 1 is a schematic cross-sectional view of one embodiment of solar cell to be manufactured by the method of the invention.

Referring to FIG. 1, a solar cell 100 includes a p-type monocrystalline silicon substrate 1 doped with boron, for example, (simply referred to as "substrate," hereinafter) and an n-type emitter layer 42 formed on a first major surface (or light-receiving surface) of substrate 1, to define a p-n junction 48 in substrate in-plane direction. The p-n junction may be provided by the structure wherein an n-type layer is formed in a p-type silicon substrate, or inversely by the structure wherein a p-type layer is formed in an n-type silicon substrate. As no structural difference is recognized between them, the following description refers to the p-type substrate.

On the major surface of emitter layer 42 is formed an electrode 5 on the light-receiving surface side. Since emitter layer 42 constitutes the light-receiving surface of the solar cell, the light-receiving side electrode 5 may be constructed of Al, Ag or the like as comprising thick bus-bar electrodes formed at suitable intervals for reducing the internal resistance and spaced-apart finger electrodes extending from the bus-bar electrode in comb-shape, for the purpose of increasing the efficiency of light incidence to p-n junction 48. The region of emitter layer 42 where the light-receiving side electrode 5 is not formed is overlaid with a light-receiving side dielectric film 43. On the other hand, the second major surface (or back surface) of substrate 1 is overlaid with a back side dielectric film 46, which is overlaid over its entire surface with a back side electrode 4 of Al or the like. The back side electrode 4 is electrically connected to the back surface of substrate 1 via conductors (or contact holes) 46h penetrating through back side dielectric film 46. Also illustrated in FIG. 1 is an antireflective coating (or SiNx film) 47.

Figure 2:
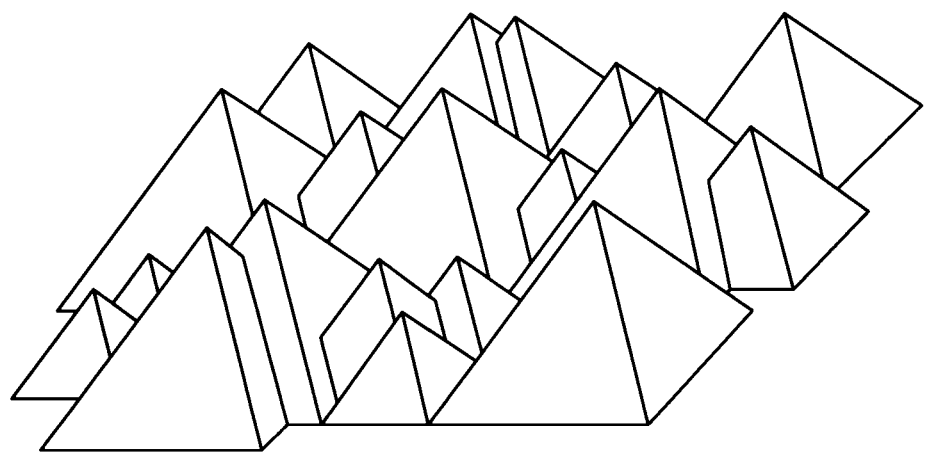
FIG. 2 is a perspective view of a texture structure formed on the substrate surface.

Since monocrystalline silicon of which substrate 1 is constructed has a high refractive index of 6.00 to 3.50 in the wavelength band of 400 to 1,100 nm, a reflection loss of incident solar ray becomes a problem. Then the substrate 1 is provided on its surface with a texture structure consisting of numerous pyramid protrusions having an outer surface of {111} plane as shown in FIG. 2.

Now referring to FIG. 3, the method of manufacturing a solar cell according to the invention is described. Understandably, the invention is not limited to the solar cell manufactured by this method.

Figure 3A:
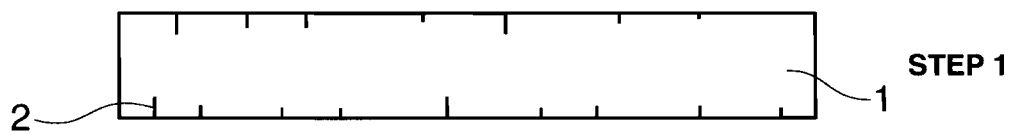
FIG. 3 illustrates in sequence the overall method of manufacturing a solar cell according to the invention.

A monocrystalline silicon ingot which is doped with Group III element such as boron or gallium to a resistivity of 0.1 to 5 Ω-cm is sliced by an outer-diameter saw, inner-diameter saw, band saw, multi-band saw, or wire saw (e.g., multi-wire saw), yielding a p-type monocrystalline silicon substrate 1 having a major surface of {100} plane (FIG. 3A: Step 1).

The monocrystalline silicon used herein may be either p-type monocrystalline silicon doped with Group III element such as boron or gallium, or n-type monocrystalline silicon doped with Group V element such as phosphorus or arsenic.

Although the disclosure refers to p-type substrate, the same is true to n-type substrate because only inversion between n and p type must be considered in forming the emitter layer.

The monocrystalline silicon substrate is cut out of an ingot which may be prepared by the floating zone (FZ) melting method or the Czochralski (CZ) method. Preparation by the CZ method is desired from the standpoint of mechanical strength.

By slicing, a work damaged layer 2 having a depth in excess of 10 μm is formed on both major surfaces of substrate 1.

Figure 3B:
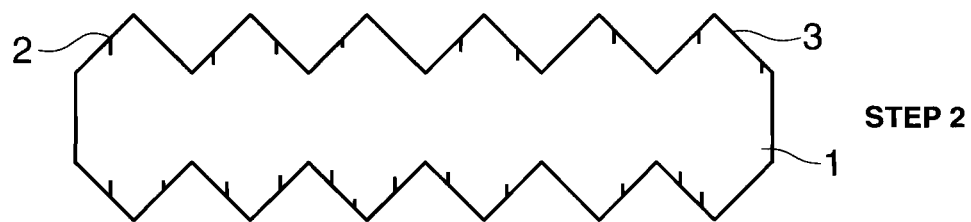

The process proceeds to Step 2 of removing the damaged layer 2 and forming a texture structure 3 (FIG. 3B). Removal of damaged layer 2 and formation of texture structure 3 is carried out by immersing substrate 1 in a hot alkaline aqueous solution of sodium hydroxide, potassium hydroxide, potassium carbonate, sodium carbonate or sodium hydrogencarbonate (concentration 0.1 to 20% by weight, temperature 60 to 100° C.) for about 10 to about 30 minutes, for thereby anisotropically etching the substrate surfaces. Notably, an amount of 2-propanol may be dissolved in the alkaline aqueous solution to promote the etching reaction.

The etching step is intentionally controlled such that the damaged layer may not be completely removed, but a fraction of the damaged layer having a depth of about 0.2 to 5 μm be left on the substrate. The depth of the residual damaged layer may be controlled in terms of the immersion time and temperature of etchant solution.

The depth of the damaged layer may become observable under a microscope or scanning electronic microscope (SEM) after the substrate surface is polished at an angle of about 5°. Alternatively, the silicon substrate surface is ground with abrasive grains, subjected to stepwise chemical etching, and evaluated by X-ray topography, whereby the density and depth of the damaged layer may be estimated. With the above-mentioned procedure, a texture structure 3 including a thin damaged layer of 0.2 to 5 μm deep is formed on the light-receiving surface.

Since the damaged layer 2 functions as getter site, the impurity is enriched in the damaged layer 2 by the getter effect, prolonging the minority carrier lifetime (or bulk lifetime) of substrate 1 and contributing to an improvement in conversion efficiency of solar cells. Particularly when a silicon substrate of the solar cell grade is used, an outstanding improvement in lifetime is achieved.

If the depth of the damaged layer is too shallow, the above-mentioned effect may not be exerted. If the depth is too much, the damaged layer can cause to increase the surface recombination rate, leading to a degradation of solar cell performance.

After the texture structure is formed, the substrate 1 is cleaned in an acidic aqueous solution in the form of hydrochloric acid, sulfuric acid, nitric acid, hydrofluoric acid or a mixture thereof. From the standpoints of economy and efficiency, cleaning in hydrochloric acid is preferred. It is acceptable for increasing the degree of cleaning to mix aqueous hydrochloric acid with 1 to 5% by weight of hydrogen peroxide water. Cleaning may be done in the solution while heating at 60 to 90° C.

On the light-receiving surface of substrate 1, an emitter layer 42 (FIG. 1) is formed by the vapor phase diffusion method using phosphorus oxychloride. In the preferred procedure intended to prevent diffusion into the second major surface (referred to as "back surface," hereinafter), a set of two substrates with their back surfaces mated is placed in a diffusion boat prior to vapor phase diffusion. Specifically, in a phosphorus oxychloride atmosphere, the substrate is heat treated at 820 to 880° C. for several tens of minutes to form an n-type layer on the light-receiving surface. The emitter layer thus formed preferably has a depth of 0.2 to 0.5 μm and a sheet resistance of 40 to 150 ohm/square (Ω/□). Since diffusion reaction forms phosphorus glass on the first major surface of substrate 1, the substrate 1 is then immersed in 2 to 5% by weight hydrofluoric acid for several minutes to remove the phosphorus glass.

It is noted that in an embodiment using an n-type substrate, a p-type emitter layer may be formed by vapor phase diffusion of $BBr_3$ at 900 to 1,000° C. for several tens of minutes.

Figure 3C:
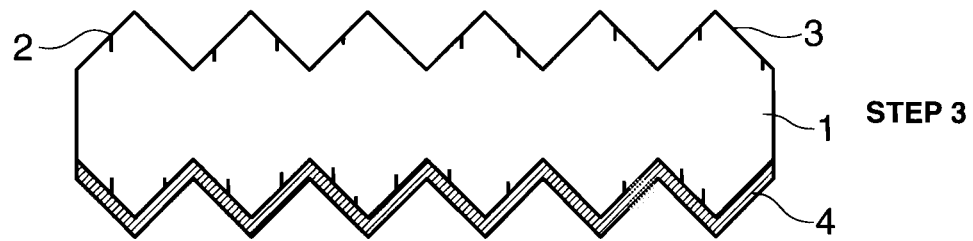
Figure 3D:
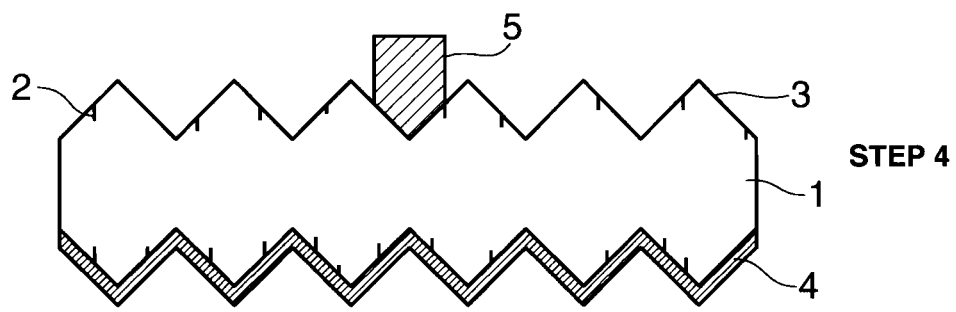

Next, a back side dielectric film 46 (FIG. 1, not shown in FIG. 3) is deposited on the second major surface of substrate 1, as shown in Step 3, the dielectric film being formed of silicon nitride as well as silicon oxide, silicon nitride, cerium oxide, alumina, tin dioxide, titanium dioxide, magnesium fluoride, tantalum oxide or the like. For example, a silicon nitride film is deposited to a thickness of about 85 to 105 nm, using a plasma-enhanced CVD system. Then contact holes 46h (FIG. 1, not shown in FIG. 3) are opened by such a technique as photolithography, mechanical machining or laser ablation, and a back side electrode 4 is formed to a thickness of 0.5 to 5 μm (FIG. 3C). While the electrode may be made of a metal such as silver, copper or the like, aluminum is most preferred for economy, workability and contact with silicon. Metal deposition is possible with any of sputtering, vacuum evaporation, screen printing and the like.

Thereafter, a light-receiving side dielectric film 43 (FIG. 1, not shown in FIG. 3) and a light-receiving side electrode 5 are formed on the first major surface of substrate 1, as shown in Step 4. The light-receiving side dielectric film 43 also plays the role of antireflective coating and may be made of silicon oxide or silicon nitride as well as cerium oxide, alumina, tin dioxide, titanium dioxide, magnesium fluoride, tantalum oxide or the like. Two or more such layers may be combined into a laminate structure. The light-receiving side dielectric film 43 may be formed by either physical vapor deposition (PVD, e.g., sputtering) or chemical vapor deposition (CVD). For the purpose of manufacturing high conversion efficiency solar cells, formation of silicon nitride by the remote plasma-enhanced CVD is preferred because a low surface recombination rate is achievable. Also, the light-receiving side electrode 5 may be formed by the evaporation, sputtering, plating, and printing techniques. Although any of these techniques may be used, the printing technique is preferred for low cost and high throughput. Once a silver paste is prepared by mixing silver powder and glass frit with an organic binder, the silver paste is screen printed and heat treated so that silver powder may penetrate through (fire through) the silicon nitride film, thereby bringing the light-receiving side electrode 5 in electric conduction to the emitter layer 42. It is noted that no problems arise when the order of treatment on the light-receiving surface and the back surface is inverted.

EXAMPLES

Example and Comparative Example are given below by way of illustration of the invention, but the invention is not limited to the Example.

An experiment was carried out to demonstrate the benefits of the invention, with the results being described below.

First, B-doped p-type silicon substrates of 200 µm thick (major surface {100} plane, as sliced) were provided. The substrates were immersed in 2.2 wt % sodium hydroxide aqueous solution heated at 82° C. for anisotropic etching to form a texture layer. At this stage, ten substrates were etched to about 7 µm (immersed for 13 minutes) so that a damaged layer of about 1 µm deep was left behind, whereas ten substrates were etched to about 12 µm (immersed for 30 minutes) so that the damaged layer was completely removed.

Next, these substrates were heat treated in phosphorus oxychloride atmosphere at 850° C. to form an emitter layer. The bulk lifetime of the substrates was measured at the start and after the emitter layer formation, with the results shown in Table 1. For both the bulk lifetimes at the start and after the heat diffusion step, the 7-µm etched substrates with residual damaged layer gave higher values than the 12-µm etched substrates with the damaged layer completely removed. This benefit is attributable to the getter effect of the residual damaged layer.

TABLE 1

| | Bulk lifetime (µs) | |
|---|---|---|
| | Start | After emitter layer formation |
| Example: 7-µm etched substrate | 589 | 588 |
| Comparative Example: 12-µm etched substrate | 452 | 327 |

Thereafter, a silicon nitride film was formed by the plasma-enhanced CVD method, and a light-receiving side electrode consisting of finger electrode and bus-bar electrode and a back side electrode were formed by the screen printing method. In this way, solar cells were manufactured. Notably, the light-receiving side electrode material used was silver paste prepared by mixing silver powder with glass frit, and the back side electrode material used was aluminum paste. Using a solar simulator, the solar cells were measured for current versus voltage under standard conditions (illumination intensity 100 mW/cm$^2$, AM 1.5, temperature 25° C.), from which conversion efficiency was computed. The results are shown in Table 2. For both the short-circuit current and open-circuit voltage, the 7-µm etched substrates with residual damaged layer gave higher values than the 12-µm etched substrates with the damaged layer completely removed. This benefit is attributable to the getter effect of the damaged layer. It is demonstrated that high efficiency solar cells can be manufactured by the method of the invention.

TABLE 2

| | Short-circuit current (mA/cm$^2$) | Open-circuit voltage (mV) | Fill factor (%) | Conversion efficiency (%) |
|---|---|---|---|---|
| Example: 7-µm etched substrate | 36.1 | 632 | 79.2 | 18.1 |
| Comparative Example: 12-µm etched substrate | 36 | 631 | 78.8 | 17.9 |

REFERENCE SIGNS LIST

1 substrate
2 damaged layer
3 texture structure
4 back side electrode
5 light-receiving side electrode
42 emitter layer
43 light-receiving side dielectric film
46 back side dielectric film
47 antireflective coating
48 p-n junction
100 solar cell

The invention claimed is:

1. A solar cell comprising a monocrystalline silicon substrate having a texture structure at its surface, wherein the monocrystalline silicon substrate includes a damaged layer at the surface of the texture structure, the damaged layer originating from a slicing step during the preparation of the substrate.

2. The solar cell of claim 1 wherein the damaged layer has a depth of 0.2 to 5 µm from the surface of the texture structure.

3. The solar cell of claim 1 wherein the surface of the monocrystalline silicon substrate is in a {100} plane.

4. A method of manufacturing a solar cell of claim 1, comprising the steps of:
removing a portion of a damaged layer originating from a slicing step during the preparation of the substrate, but leaving other portion of the damaged layer originating from a slicing step; and
forming a texture on the monocrystalline silicon substrate by chemical etching, said monocrystalline silicon substrate having on its surface a damaged layer originating from the slicing step during the preparation of the substrate,
forming a p-n junction in the monocrystalline silicon substrate, and
forming electrodes on the monocrystalline silicon substrate,
wherein the step of forming a texture is carried out such that the damaged layer originating from the slicing step during the preparation of the substrate remains at the surface of the textured substrate.

5. The method of claim 4 wherein the step of forming a texture is carried out such that the damaged layer may have a depth of 0.2 to 5 µm from the surface of the texture structure after the texture formation.

6. The method of claim 4 wherein the monocrystalline silicon substrate has a major surface of {100} plane, and the chemical etching is anisotropic etching using an alkaline aqueous solution so that the texture structure is formed as an arrangement of regular pyramid protrusions delimited by four {111} planes.

7. The method of claim 4 wherein the alkaline aqueous solution used for chemical etching of the surface of the monocrystalline silicon substrate is an aqueous solution containing sodium hydroxide, potassium hydroxide, potassium carbonate, sodium carbonate or sodium hydrogencarbonate.

8. The solar cell of claim 1 wherein the damaged layer is a fraction of a damaged layer formed by the slicing step during the preparation of the substrate.

9. The solar cell of claim 1 further comprising an emitter layer on the light-receiving surface of the texture structure, an antireflective coating on the emitter layer and front and back side electrodes.

10. The method of claim 4 wherein the steps of removing a portion of the damaged layer and forming the texture are carried out by anisotropically etching the substrate surfaces.

11. The method of claim 4 further comprising the steps of forming p-n junction, forming antireflective coating and forming front and back side electrodes after forming the texture.

* * * * *